United States Patent
Mueller et al.

(10) Patent No.: US 8,163,086 B2
(45) Date of Patent: Apr. 24, 2012

(54) HALOGEN ASSISTED PHYSICAL VAPOR TRANSPORT METHOD FOR SILICON CARBIDE GROWTH

(75) Inventors: Stephan G. Mueller, Troy, NY (US); Hudson M. Hobgood, Pittsboro, NC (US); Valeri F. Tsvetkov, Gasburg, VA (US)

(73) Assignee: Cree, Inc., Durham, NC (US)

( * ) Notice: Subject to any disclaimer, the term of this patent is extended or adjusted under 35 U.S.C. 154(b) by 1270 days.

(21) Appl. No.: 11/846,574

(22) Filed: Aug. 29, 2007

(65) Prior Publication Data

US 2009/0056619 A1   Mar. 5, 2009

(51) Int. Cl.
*C30B 21/02* (2006.01)
*C30B 21/04* (2006.01)

(52) U.S. Cl. .................. 117/108; 117/109; 117/202

(58) Field of Classification Search .................. 117/108, 117/109, 200, 945
See application file for complete search history.

(56) References Cited

U.S. PATENT DOCUMENTS

| | | | |
|---|---|---|---|
| 4,866,005 A | 9/1989 | Davis et al. | |
| 5,679,153 A | 10/1997 | Dmitriev et al. | |
| 6,749,685 B2 | 6/2004 | Coleman | |
| 6,974,720 B2 | 12/2005 | Sumakeris et al. | |
| 7,147,715 B2 | 12/2006 | Malta et al. | |
| 7,192,482 B2 | 3/2007 | Mueller et al. | |
| 2005/0255245 A1 | 11/2005 | Fanton et al. | |
| 2008/0149020 A1* | 6/2008 | Janzen et al. | ............ 117/89 |

OTHER PUBLICATIONS

A.N. Vorob'Ev et al., "Modeling of gas phase nucleation during silicon carbide chemical vapor deposition," Diamond and Related Materials 9 (2000) pp. 472-475.
M. Fanton, et al, "Growth of nitrogen-doped SiC boules by halide chemical vapor deposition," Journal of Crystal Growth 287 (2006) pp. 359-362.
S. Nigam, et al., "Growth kinetics study in halide chemical vapor deposition of SiC," Journal of Crystal Growth 284 (2005) pp. 112-122.
M.A. Fanton, et al., "Thermodynamic equilibrium limitations on the growth of SiC by halide chemical vapor deposition," Journal of Applied Physics 101, 014903 (2007) 5 pages.
US RE34,681, 02/1995, Davis et al. (withdrawn)

* cited by examiner

*Primary Examiner* — Bob M Kunemund
(74) *Attorney, Agent, or Firm* — Christopher J. Knors; Moore & Van Allen PLLC

(57) ABSTRACT

A physical vapor transport growth technique for silicon carbide is disclosed. The method includes the steps of introducing a silicon carbide powder and a silicon carbide seed crystal into a physical vapor transport growth system, separately introducing a heated silicon-halogen gas composition into the system in an amount that is less than the stoichiometric amount of the silicon carbide source powder so that the silicon carbide source powder remains the stoichiometric dominant source for crystal growth, and heating the source powder, the gas composition, and the seed crystal in a manner that encourages physical vapor transport of both the powder species and the introduced silicon-halogen species to the seed crystal to promote bulk growth on the seed crystal.

30 Claims, 3 Drawing Sheets

HALOGEN ASSISTED PHYSICAL VAPOR TRANSPORT METHOD FOR SILICON CARBIDE GROWTH

BACKGROUND

The present invention relates to the bulk growth of large, high-quality, silicon carbide crystals for electronic and related applications.

Silicon carbide (SiC) is a compound of significant interest as a material for both substrates and active layers for high voltage and high frequency semiconductor devices as well as being of interest in the manufacture and structure of certain types of light emitting diodes.

From an electronic standpoint, silicon carbide has a number of theoretical and practical advantages that make its use desirable in microelectronic devices. Silicon carbide has a wide band gap, a high critical breakdown field (approximately two mega-volts per centimeter), and a high thermal conductivity (about five watts per centimeter-Kelvin). Silicon carbide is also physically very hard. Silicon carbide has a high electron drift velocity, excellent thermal stability, and excellent radiation resistance or "hardness." These advantages have been recognized and described thoroughly in the patent and non-patent literature.

As is the case with other semiconductor materials, silicon carbide can be grown as "bulk" crystals or as epitaxial layers. Bulk growth generally (although not necessarily exclusively) refers to growth techniques that produce larger crystals for use as substrates and related purposes. Bulk growth techniques, although not necessarily "fast" in an absolute sense, generally proceed at a rate sufficient to make the techniques economically worthwhile and the resulting bulk crystals economically obtainable. Bulk crystal growth typically refers to growth from a seed, but as used herein can also refer to the growth of layers which are sufficiently thick to share the functional characteristics of bulk grown crystals.

By way of comparison, epitaxial growth is typically used to produce smaller portions—most often layers—of a semiconductor material with high purity, high crystal quality, and specific doping parameters. Relatively speaking, epitaxial growth generally proceeds more slowly than bulk growth, but produces a higher quality crystal. Furthermore, because epitaxial layers can serve their purpose even when relatively thin, the longer time required to grow them is acceptable in exchange for their higher quality.

Bulk growth of silicon carbide is typically carried out by one of two methods: sublimation from a source powder or high temperature chemical vapor deposition (HTCVD).

The HTCVD technique uses a seed crystal, but instead of a silicon carbide source powder, silicon containing species (typically silane) and carbon containing species (typically propane) are introduced as gases.

The HTCVD technique can produce high purity, highly uniform material with controlled electronic characteristics. Nevertheless, longer (larger) crystals are hard to obtain because the growth efficiency is relatively low and parasitic reactions compete with the desired silicon carbide growth. Additionally, silane tends to decompose in significant amounts at relatively low temperatures (in some cases below 400° C.) as compared to those needed for bulk SiC growth (e.g. about 2000° C.). HTCVD suffers from other disadvantages including the tendency of the reaction products to deposit everywhere—i.e. throughout the deposition chamber as well as on the desired surface—which wastes material and requires the deposition apparatus to be cleaned frequently.

Furthermore, the displacement reactions characteristic of HTCVD typically generate hydrogen as a reaction product. In turn, hydrogen will tend to etch silicon carbide at HTCVD temperatures.

Sublimation, also referred to as physical vapor transport (PVT), is usually carried out in the presence of a seed. In this technique, a seed crystal of silicon carbide and a silicon carbide source powder are both placed into a crucible (typically formed of graphite). The crucible is then heated in a manner that creates a temperature gradient between the source powder and the seed, and with the powder generally being warmer than the seed. At appropriate temperatures (i.e. at least about 1900-2000° C.), silicon carbide source powder will sublime to form gaseous species (dominated by Si, $Si_2C$ and $SiC_2$). The temperature gradient encourages the species to migrate to the seed, which is typically maintain about 100-200° C. cooler than the source powder. The migrating species condense on the seed crystal providing the desired crystal growth.

Although relatively well understood and well-established (e.g., commonly assigned U.S. Pat. No. 4,866,005) the static use of source powder in a closed crucible can limit the quality of the crystal eventually produced.

In this regard, it will be understood by those familiar with electronic devices and semiconductor materials that the term "quality," is applied in a relative sense. Sublimation produces very high-quality silicon carbide crystals for many purposes. Nevertheless, when SiC devices are used at extremely high power—which represents one of SiC's advantages—even a small number of defects can degrade performance noticeably or even lead to device breakdown. Thus, increasing the quality of silicon carbide bulk crystals always remains of interest.

As one particular problem, and because of the thermodynamic differences between silicon and carbon, silicon carbide tends to sublime in a non-stoichiometric fashion. Although the mechanism is not totally understood, the silicon content of the source powder tends to deplete more quickly than the carbon content. This produces a carbon-rich source powder, a characteristic referred to as "powder graphitization." Even source material that is intentionally made or selected to be silicon-rich becomes graphitized over time.

In turn, powder graphitization causes the ratio of the vaporized silicon and carbon species to change during any given growth run. Such changes can produce undesired changes in the growing crystal. For example, higher silicon-to-carbon ratios tend to produce the 3C polytype of silicon carbide even when the 6H polytype is being used as the seed.

As another potential factor the composition of transported gases that produces the best initial nucleation on the seed crystal may be different from the composition that produces the best bulk growth (and vice versa). Thus, in the conventional physical vapor transport (sublimation) systems, neither nucleation nor bulk growth may be optimized. Instead, both may be compromised based upon the fixed starting material.

Stated differently, in conventional physical vapor transport growth techniques, the relevant system is loaded with a starting material and then heated to drive the sublimation growth of the resulting crystal. The application of heat, however, is typically the only step that can be manipulated during the growth process; i.e., the starting materials are locked in and cannot be modified as growth proceeds.

Other problems exist. For example, where nitrogen is used as a dopant to create n-type material, the normal and expected process is for the nitrogen dopant atoms to replace carbon atoms in the crystal structure. Changing the ratio of silicon-to-carbon, however, causes the nitrogen to compete with a different amount of carbon for a given position in the growing crystal. This, among other factors, can result in intrinsic defects such as silicon vacancies and carbon vacancies. Furthermore, it is generally expected that the formation (or prevention) of micropipes is affected by the silicon to carbon ratio in the vapor phase.

Additionally, these growth issues are of greater concern as the diameter of the growing crystal increases. In this regard, in a commercial context growing larger diameter crystals is usually more efficient than growing smaller diameter crystals. In silicon-based technology, wafers as large as eight inches (200 millimeters) in diameter are commercially available and widely understood. In silicon carbide technology, however, three and four inch wafers (75-100 mm) still remain as a commercial upper limit.

Accordingly, interest continues to exist in improving the techniques for bulk growth of silicon carbide end in correspondingly improving the resulting bulk crystals.

The foregoing and other objects and advantages of the invention and the manner in which the same are accomplished will become clearer based on the followed detailed description taken in conjunction with the accompanying drawings.

SUMMARY

In one aspect the invention is a physical vapor transport growth technique for silicon carbide. The method includes the steps of introducing a silicon carbide powder and a silicon carbide seed crystal into a physical vapor transport growth system, separately introducing a heated silicon-halogen gas composition into the system in an amount that is less than the stoichiometric amount of the silicon carbide source powder so that the silicon carbide source powder remains the stoichiometric dominant source for crystal growth, and heating the source powder, the gas composition, and the seed crystal in a manner that encourages physical vapor transport of both the powder species and the introduced silicon-halogen species to the seed crystal to promote bulk growth on the seed crystal.

In another aspect, the invention includes the steps of heating a silicon carbide source powder to sublimation temperatures in the presence of a silicon carbide seed crystal that is maintained at a cooler temperature than the silicon carbide source powder to encourage physical vapor transport between the source powder onto the seed crystal to cause the seed crystal to grow, and during sublimation of the source powder and sublimation growth of the seed crystal, introducing a silicon-halogen gas composition in the presence of the seed crystal and the silicon carbide source powder to moderate or eliminate the variations in the stoichiometry of the gas species that would otherwise occur in the presence of silicon carbide source powder alone.

In another aspect, the invention is a system for bulk growth of silicon carbide. In this aspect, the invention includes a graphite crucible, a seed crystal in the graphite crucible, a silicon carbide source powder in the graphite crucible, a source of silicon-halogen gas composition, and an inlet for introducing a silicon-halogen gas composition into the crucible at a position at which the silicon-halogen gas composition can react with gas species generated by the source powder rather than directly with the source powder itself.

DETAILED DESCRIPTION

The invention is a physical vapor transport growth technique for silicon carbide that preserves the advantages gained from using a silicon carbide source powder while moderating or eliminating the issues raised by graphitization of the source powder. The technique includes the step of introducing a silicon carbide powder and a silicon carbide seed crystal into a physical vapor transport growth system. The use of the silicon carbide powder differentiates the invention from some of the high temperature gas source techniques referred to elsewhere herein.

The silicon-to-carbon ratio in the growth system is controlled by separately introducing a heated silicon-halogen gas composition is into the system in an amount that is less than the stoichiometric amount of the silicon carbide source powder. The silicon carbide source powder remains the stoichiometric dominant source for crystal growth.

The source powder, the gas composition and the seed crystal are heated in a manner that encourages physical vapor transport from both the powder source and the introduced silicon-halogen species to the seed crystal to promote bulk growth on the seed crystal.

To date, the effects of the added halogen-containing species are empirical. Thus, it appears for example, that a lower ratio of silicon to carbon in the vapor phase encourages unwanted 15R polytype inclusions in a growing 6H crystal. In such a case, the added silicon-halogen composition provides additional silicon to moderate the vapor species towards a more favorable Si:C ratio.

Those persons of ordinary skill in this art will recognize that the general principles of sublimation or physical vapor transport growth are always applied in the context of specific and individual equipment and circumstances. Thus, such persons will understand that the descriptions herein are exemplary rather than limiting and such persons will be able to carry out the techniques described herein without undue experimentation.

Additionally, the physical vapor transport or sublimation growth of silicon carbide has been addressed in a number of issued U.S. patents including U.S. Pat. Nos. 4,866,005; RE34,861; 6,749,685; 7,147,715; 7,192,482; 5,679,153; and 6,974,720 the contents of each of which is incorporated entirely herein by reference. These are exemplary, rather than limiting of the information available concerning bulk growth of silicon carbide.

Figure 1:
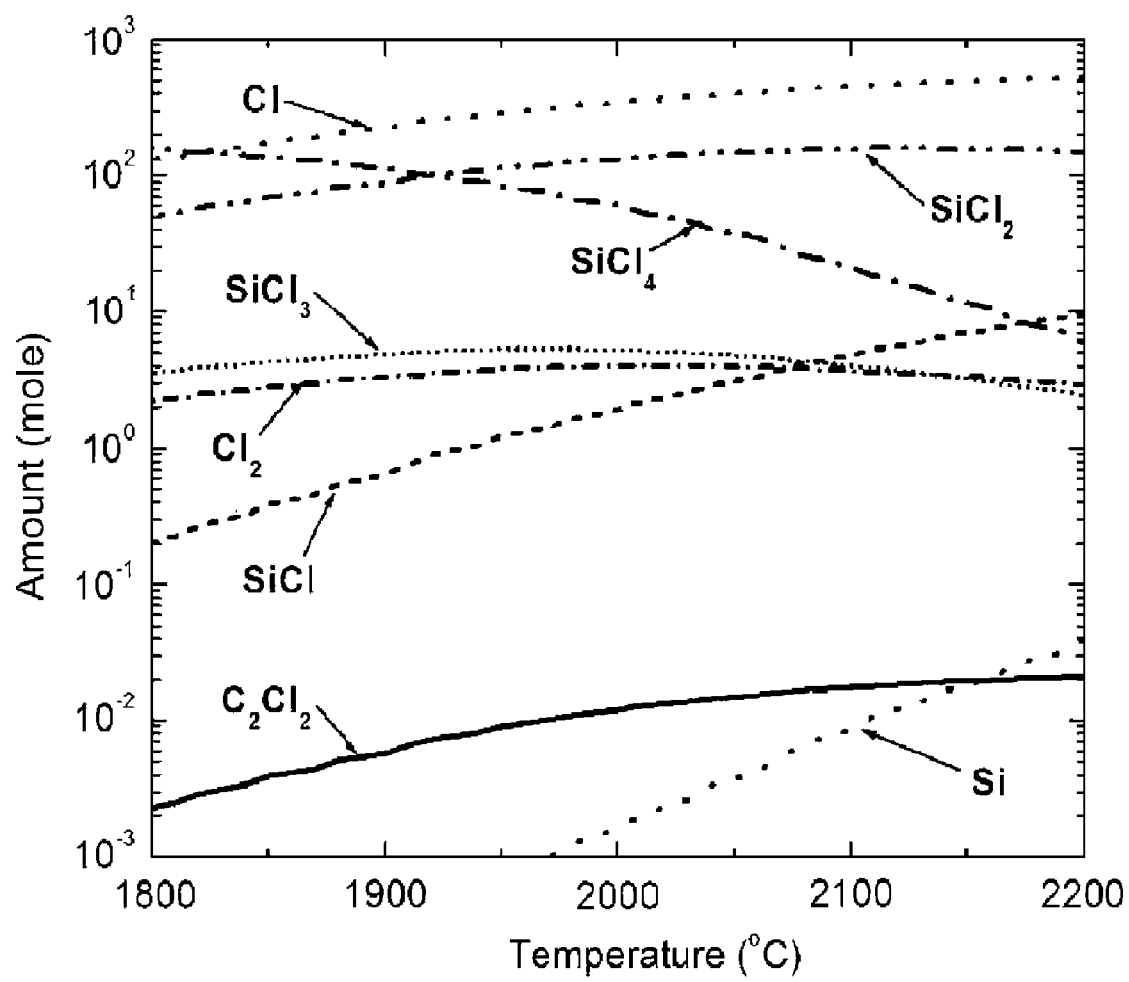
FIG. 1 is a plot of calculated equilibrium amounts of various species in a silicon, carbon, and chlorine system at physical vapor transport crystal growth temperatures.
Figure 2:
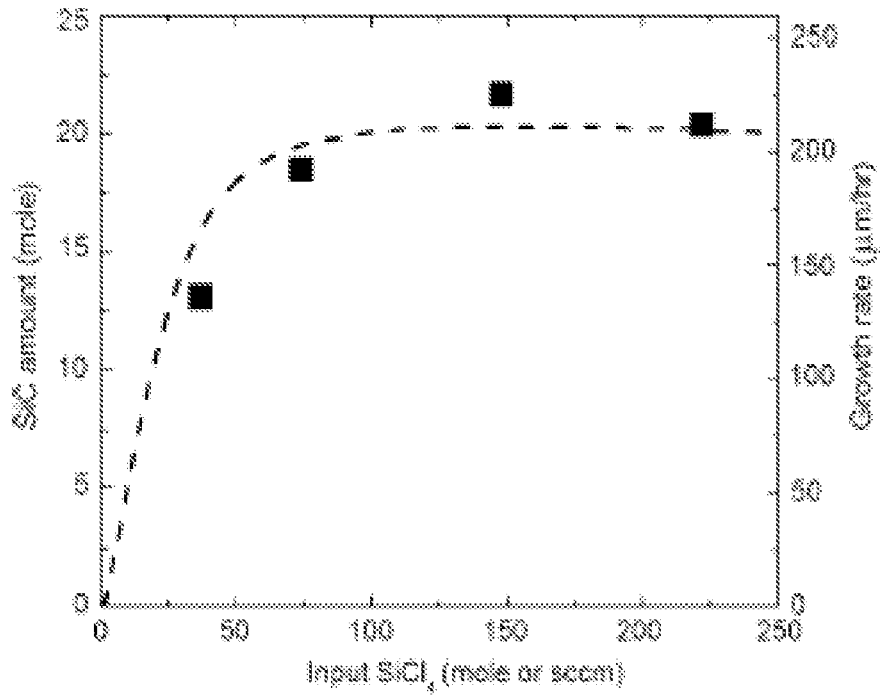
FIG. 2 is a comparison between the calculated equilibrium amounts of SiC formed in a reaction zone and the experimental growth rates as a function of the amount of $SiCl_4$ present.
Figure 3:
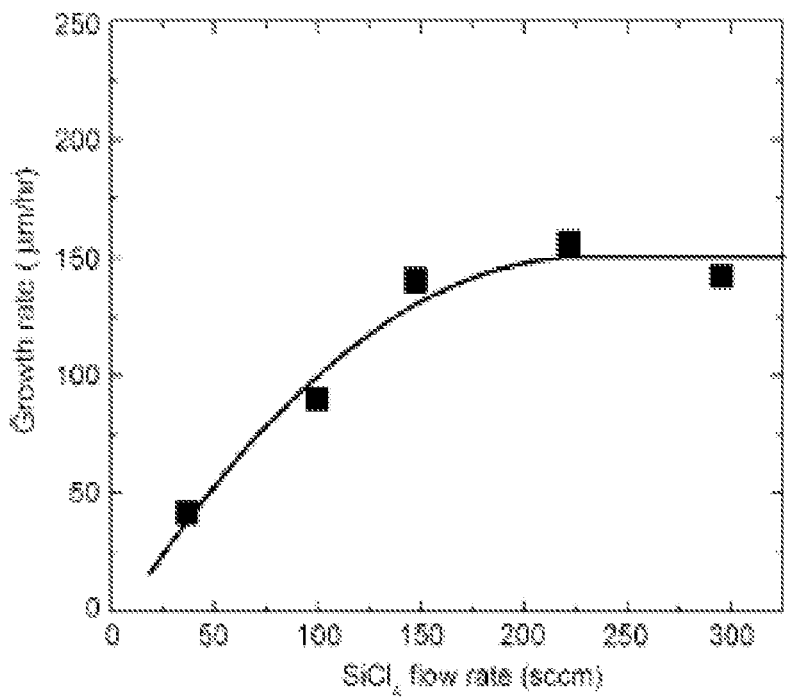
FIG. 3 is a plot of SiC growth rate as a function of $SiCl_4$ flow in the presence of a fixed amount of propane.

FIGS. 1, 2, and 3 provide information about the behavior of silicon, carbon, and chlorine (including ions of each and compounds of each) at the temperatures generally used or approached for physical vapor transport growth of silicon carbide. FIG. 1 is taken from Nigam, *Growth kinetics study in halide chemical vapor deposition of SiC*, J. CRYSTAL GROWTH 284, pages 112-22 (2005). FIG. 1 shows the calculated equilibrium amounts of dominant species in a system of silicon tetrachloride and argon as a function of temperature at a pressure of 200 torr. The input amounts of argon, silicon tetrachloride and carbon used in the calculations were fixed.

FIG. 1 shows that silicon tetrachloride remains stable (i.e., undissociated) at temperatures below about 1800° C. and then dissociates into several of the other species shown in FIG. 1 at higher temperatures. In particular, the amount of $C_2Cl_2$, the most dominant of the carbon-containing species, is four orders of magnitude lower than the primary silicon containing species, which in the temperature regime of FIG. 1 is $SiCl_2$.

Thus, the presence of the halogen provides stable compounds for silicon and thus provide the means for controlling the stoichiometry in the growth system by controlling (using) the added silicon-halogen gas.

FIGS. 2 and 3 were taken from the same source. FIG. 2 presents the comparison between a calculated equilibrium amount of silicon carbide (the dashed line) formed in a reaction zone of a totally gas fed system at 2050° C. and 200 torr and the experimental growth rates (black squares) as a function of the amount of $SiCl_4$ added. FIG. 2 illustrates that at low flow rates of $SiCl_4$ the amount of silicon carbide formed increases rapidly but then becomes saturated for higher flow rates (amounts) of $SiCl_4$ as the other source materials become depleted. For purposes of the invention, FIG. 2 illustrates the manner in which the growth rate of silicon carbide can be controlled by using small amounts of silicon tetrachloride.

FIG. 3 shows the growth rate of silicon carbide as a function of $SiCl_4$ flow (amount) at a fixed propane flow in a fully gas fed system. This also illustrates that the growth rate of silicon carbide increases linearly at low amounts of $SiCl_4$ but becomes saturated at higher amounts of $SiCl_4$. In turn, this illustrates the potential for controlling silicon carbide growth rate by introducing small amounts—i.e., much smaller than stoichiometric—of the halogen-silicon gas.

Returning to the method of the invention, the silicon-halogen composition is introduced into the growth system (typically a graphite crucible) at a position that is consistent with the position of the vapor species generated by the heated silicon carbide source powder. Stated differently, the silicon-halogen composition is introduced at a position where it can react as necessary and desired with the vaporized species generated by the heated silicon carbide source powder.

In addition to silicon tetrachloride (tetrachlorosilane), alternative halogen sources could include bromosilane ($SiHBr_3$), bromotrichlorosilane ($SiBrCl_3$), chlorosilane ($SiH_3Cl$), dibromosilane ($SiH_2Br_2$), dichlorosilane ($SiH_2Cl_2$), iodosilane ($SiH_3I$), tetrabromosilane ($SiBr_4$), tetraiodosilane ($SiI_4$), tribromosilane ($SiHBr_3$), tribromochlorosilane ($SiBr_3Cl$), trichlorosilane ($SiHCl_3$), triiodosilane ($SiHI_3$), and combinations of these compositions.

Fluorine-containing compounds are theoretically possible but are often disfavored from a practical standpoint because the high electronegativity (and thus reactivity) of fluorine makes it a candidate for unexpected sudden reactions—including explosions—that should be avoided in laboratory and manufacturing circumstances.

The seed is introduced with a polytype that is desired for the continuing bulk growth, with the 6H polytype being used most frequently. Other polytypes (e.g., 4H, 15R) of silicon carbide, however, can be grown in the same manner.

The halogenated silicon composition can be partially or fully halogenated as may be desired or necessary in particular embodiments. Most commonly, the silicon-halogen gas is selected from the group consisting of $SiCl_4$, $SiHCl_3$, $Si_2Cl_6$ and combinations thereof.

The physical vapor transport technique is carried out below atmospheric pressure. This increases the mean free path of the various gaseous species and provides a greater degree of control over the various experimental parameters. Most typically, the total pressure in the physical vapor transport system is maintained below about 300 torr and typically at about 200 torr.

The physical vapor transport is typically carried out at a temperature that maximizes the growth rate of the bulk crystal while minimizing other factors (such as etching) that increase at higher temperatures and that would reduce the rate of bulk growth. Generally speaking, the source powder is heated to a temperature of at least about 1900°-2000° C. and sometimes in a range as high as 2200°-2500° C. The seed crystal is typically maintained at a temperature approximately 100°-200° C. less than the temperature of the source powder. This creates a thermal gradient that helps drive the relevant vaporized species from the source powder to the seed crystal. As known to those familiar with sublimation growth, the gradient can be adjusted axially (parallel to the growth direction) or radially (perpendicular to the growth direction).

Because the invention includes the step of separately introducing the heated silicon-halogen gas, the temperatures in the system are typically maintained below the thermal decomposition temperatures of such gases. In order to thermally control the growth system the silicon-halogen gas is typically preheated to temperatures approaching the temperatures of the seed and the source powder before introducing the silicon halogen gas composition into the system. The benefit of the silicon tetrachloride appears to be based on (at least theoretically) the strength of the silicon-chlorine bond which has a dissociation energy of 111 kilocalories per mole as compared to the silicon-hydrogen bond in silane which has a dissociation energy of 90 kilocalories per mole.

One of the advantageous features of the invention is the ability to use silicon carbide source powder rather than carbon-containing gases as source materials. Thus, in exemplary embodiments the invention comprises limiting carbon-containing source gases to gaseous species that are generated from the silicon carbide source powder rather than source gases containing carbon that are introduced separately.

If desired, a dopant-containing gas can be introduced into the system to dope the bulk crystal, with nitrogen typically being introduced for this purpose and to dope the growing crystal n-type.

The invention can also be expressed as the steps of heating a silicon carbide source powder to sublimation temperatures in the presence of a silicon carbide seed crystal that is maintained at a cooler temperature than the silicon carbide source powder to encourage physical vapor transport between the source powder and the seed crystal to encourage bulk growth on the seed crystal. During sublimation of the source powder and the sublimation growth of the seed crystal a silicon-halogen gas is introduced in the presence of the seed crystal and the silicon carbide source powder to moderate or eliminate the variations in the stoichiometry of the gas species that would otherwise occur in the presence of silicon carbide source powder alone.

By combining a source powder with a known or determined free Si content with the capacity to introduce SiCl4 or a related halogen-containing gas, the invention provides a stable and consistent (repeatable) process for increasing the yield of high quality silicon carbide in bulk crystals.

Figure 4:
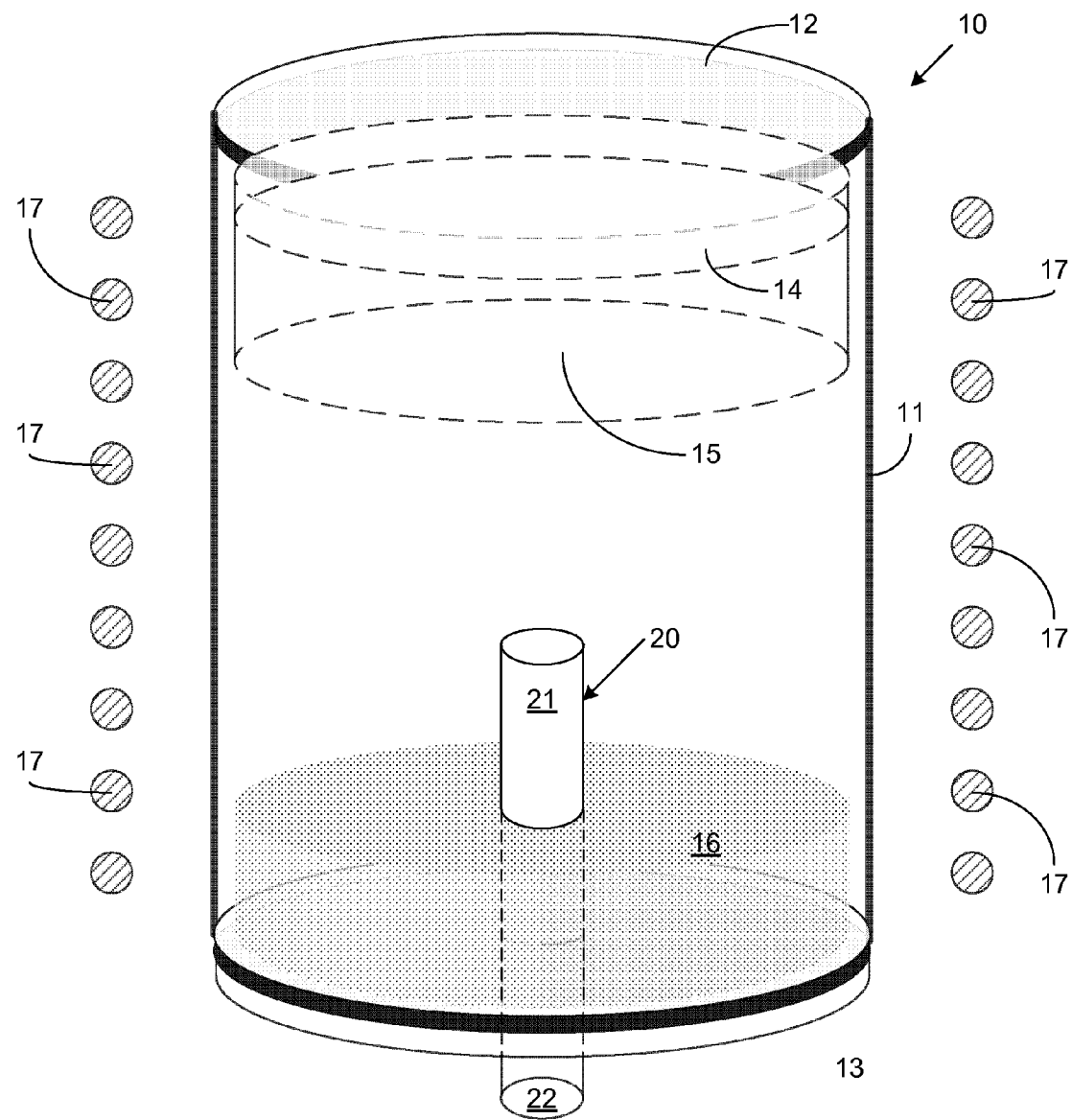
FIG. 4 is a schematic diagram of a growth system useful in the present invention.

FIG. 4 illustrates a graphite crucible broadly designated at 10. The crucible is formed of a generally cylindrical wall 11, a lid 12 and a floor 13. The position of the seed crystal is illustrated at 14, and the growing bulk crystal 15 extends downwardly from the seed crystal 14. Silicon carbide powder is indicated by the shaded portion 16 at the bottom of the crucible 10. The crucible 10 can be heated in any conventional manner including the use of an induction coil symbolized by the circles 17 that inductively heats the graphite crucible 10.

In this embodiment the halogen containing gas is introduced through a tube broadly designated at 20. It will be understood that the tube is illustrated schematically and that individual positions and structures for the tube 20 can be varied within the scope of the present invention. The tube 20 has an upper portion 21 extending above the source powder 16 and a lower portion 22 that extends downwardly from the floor 13 of the crucible 10. The desired halogen-containing gas is introduced into the crucible 10 through the bottom portion 22 of the tube 20. The upper portion 21 extends upwardly into the crucible 10 so that heated gases exiting the tube 20 are in position to react with vaporized species generated from the source powder 16.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A physical vapor transport growth technique for silicon carbide comprising:
   introducing a silicon carbide powder and a silicon carbide seed crystal into a physical vapor transport growth system;
   controlling the silicon-to-carbon ratio in the growth system by separately introducing a heated silicon-halogen gas composition into the system in an amount that is less than the stoichiometric amount of the silicon carbide source powder; and
   heating the source powder, the gas composition, and the seed crystal in a manner that encourages physical vapor transport of both the powder species and the introduced silicon-halogen species to the seed crystal to promote bulk growth on the seed crystal.

2. A physical vapor transport growth technique according to claim 1 comprising introducing the silicon-halogen composition into the growth system at a position consistent with the position of vapor species generated by the heated silicon carbide source powder.

3. A physical vapor transport growth technique according to claim 1 comprising introducing a silicon carbide seed crystal into the sublimation system that has a polytype selected from the group consisting of the 4H, 6H, and 15R polytypes of silicon carbide.

4. A physical vapor transport growth technique according to claim 1 comprising introducing a partially halogenated silicon composition into the sublimation system.

5. A physical vapor transport growth technique according to claim 1 comprising introducing a fully halogenated silicon composition into the sublimation system.

6. A physical vapor transport growth technique according to claim 1 comprising introducing a gas selected from the group consisting of tetrachlorosilane ($SiCl_4$), $Si_2Cl_6$, bromosilane ($SiHBr_3$), bromotrichlorosilane ($SiBrCl_3$), chlorosilane ($SiH_3Cl$), dibromosilane ($SiH_2Br_2$), dichlorosilane ($SiH_2Cl_2$), iodosilane ($SiH_3I$), tetrabromosilane ($SiBr_4$), tetraiodosilane ($SiI_4$), tribromosilane ($SiHBr_3$), tribromochlorosilane ($SiBr_3Cl$), trichlorosilane ($SiHCl_3$), triiodosilane ($SiHI_3$) and combinations thereof.

7. A physical vapor transport growth technique according to claim 1 comprising maintaining the total pressure in the sublimation system below atmospheric pressure.

8. A physical vapor transport technique according to claim 7 comprising maintaining the total pressure in the physical vapor transport system below 300 Torr.

9. A physical vapor transport growth technique according to claim 1 wherein the step of heating comprises heating the system to a temperature that maximizes the growth rate of the bulk crystal while minimizing the amount of side reactions that would reduce the rate of bulk growth.

10. A physical vapor transport growth technique according to claim 9 comprising heating the source powder to a temperature of about 2000° C. and the seed crystal to a temperature of about 1900° C.

11. A physical vapor transport growth technique according to claim 9 comprising heating the source powder to a temperature of between about 2200° and 2500° C. and heating the seed crystal to a temperature approximately 100° C. less than the temperature of the source powder.

12. A physical vapor transport growth technique according to claim 1 comprising maintaining the temperatures in the system below the thermal decomposition temperatures of the desired halogenated species.

13. A physical vapor transport growth technique according to claim 1 comprising introducing a 100 millimeter seed crystal into the system.

14. A physical vapor transport growth technique according to claim 1 comprising pre-heating the silicon-halogen gas composition to temperatures approaching the temperatures of the seed and source powder prior to introducing the silicon-halogen gas composition into the system.

15. A physical vapor transport growth technique according to claim 1 comprising limiting carbon containing source gases to source gases generated from the silicon carbide source powder.

16. A physical vapor transport growth technique according to claim 1 further comprising introducing a nitrogen containing gas species into the system to dope the bulk growth crystal with nitrogen.

17. A physical vapor transport growth technique according to claim 1 comprising moderating the amount of the introduced silicon-halogen composition during crystal growth to thereby moderate the composition of the vapor phase species and the characteristics of the growing bulk crystal.

18. A method for bulk growth of high quality silicon carbide crystals comprising:
   heating a silicon carbide source powder to sublimation temperatures in the presence of a silicon carbide seed crystal that is maintained at a cooler temperature than the silicon carbide source powder to encourage physical vapor transport between the source powder onto the seed crystal to cause the seed crystal to grow; and
   during sublimation of the source powder and sublimation growth of the seed crystal, introducing a silicon-halogen gas composition in the presence of the seed crystal and the silicon carbide source powder to moderate or eliminate the variations in the stoichiometry of the gas species that would otherwise occur in the presence of silicon carbide source powder alone.

19. A method according to claim 18 comprising limiting the amount of introduced silicon-halogen composition so that the amount of species generated by the source powder is greater than the amount introduced by the silicon-halogen composition.

20. A method according to claim 18 comprising heating the silicon carbide source powder to a temperature of about 2000° C. while maintaining the silicon carbide seed crystal at a temperature of about 1900° C.

21. A method according to claim 18 comprising heating the source powder to a temperature of between about 2200° and 2500° C. and heating the seed crystal to a temperature approximately 100° C. less than the temperature of the source powder.

22. A method according to claim 18 comprising maintaining the temperatures in the system below the thermal decomposition temperatures of the desired halogenated species.

23. A method according to claim 18 comprising heating the source powder and introducing the silicon-halogen composition at less than atmospheric pressure.

24. A method according to claim 23 comprising heating the source powder and introducing the silicon-halogen composition at less than 300 torr.

25. A method according to claim 18 comprising introducing a fully halogenated silicon-halogen composition.

26. A method according to claim 18 comprising introducing a partially halogenated silicon-halogen composition.

27. A method according to claim 18 comprising introducing a gas selected from the group consisting of tetrachlorosilane ($SiCl_4$), $Si_2Cl_6$, bromosilane ($SiHBr_3$), bromotrichlorosilane ($SiBrCl_3$), chlorosilane ($SiH_3Cl$), dibromosilane ($SiH_2Br_2$), dichlorosilane ($SiH_2C_{l2}$), iodosilane ($SiH_3I$), tetrabromosilane ($SiBr_4$), tetraiodosilane ($SiI_4$), tribromosilane ($SiHBr_3$), tribromochlorosilane ($SiBr_3Cl$), trichlorosilane ($SiHCl_3$), triiodosilane ($SiHI_3$) and combinations thereof.

28. A method according to claim 18 comprising heating the silicon carbide source powder in the presence of a silicon carbide seed crystal that has a polytype selected from the group consisting of the 4H, 6H, and 15R polytypes of silicon carbide.

29. A method according to claim 18 comprising limiting carbon containing source gases to source gases generated from the silicon carbide source powder.

30. A method according to claim 18 further comprising introducing a nitrogen containing gas species to dope the bulk growth crystal with nitrogen.

* * * * *